(12) United States Patent
Kotou et al.

(10) Patent No.: US 6,362,024 B1
(45) Date of Patent: Mar. 26, 2002

(54) SEMICONDUCTOR MEMORY DEVICE MANUFACTURING METHOD WITH FUSE CUTTING PERFORMANCE IMPROVED

(75) Inventors: Makoto Kotou; Shinya Iwasa, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/440,464

(22) Filed: Nov. 15, 1999

(30) Foreign Application Priority Data

Nov. 20, 1998 (JP) ............................................ 10-331182

(51) Int. Cl.⁷ .............................................. H01L 21/82
(52) U.S. Cl. ........................ 438/132; 438/669; 438/740; 438/624
(58) Field of Search ................................ 438/132, 624, 438/633, 637, 669, 639, 970, 740, FOR 126, FOR 555

(56) References Cited

U.S. PATENT DOCUMENTS 6,168,977 B1 * 1/2001 Konishi
6,174,753 B1 * 1/2001 Liao

FOREIGN PATENT DOCUMENTS

| JP | 7-130845 | 5/1995 |
| JP | 9-51038 | 2/1997 |
| JP | 10-256373 | 9/1998 |

\* cited by examiner

*Primary Examiner*—George Fourson
*Assistant Examiner*—Joannie Adelle Garcia
(74) *Attorney, Agent, or Firm*—Sughrue Mion, PLLC

(57) ABSTRACT

In a method of manufacturing a semiconductor memory device, a first interlayer insulating film is formed to have at least one fuse therein. An etching stopper film is formed on the first interlayer insulating film. A first layer is formed on the etching stopper film. The first layer is etched to the etching stopper film using a first mask. Then, the etching stopper film is etched to produce a fuse cutting window.

11 Claims, 12 Drawing Sheets

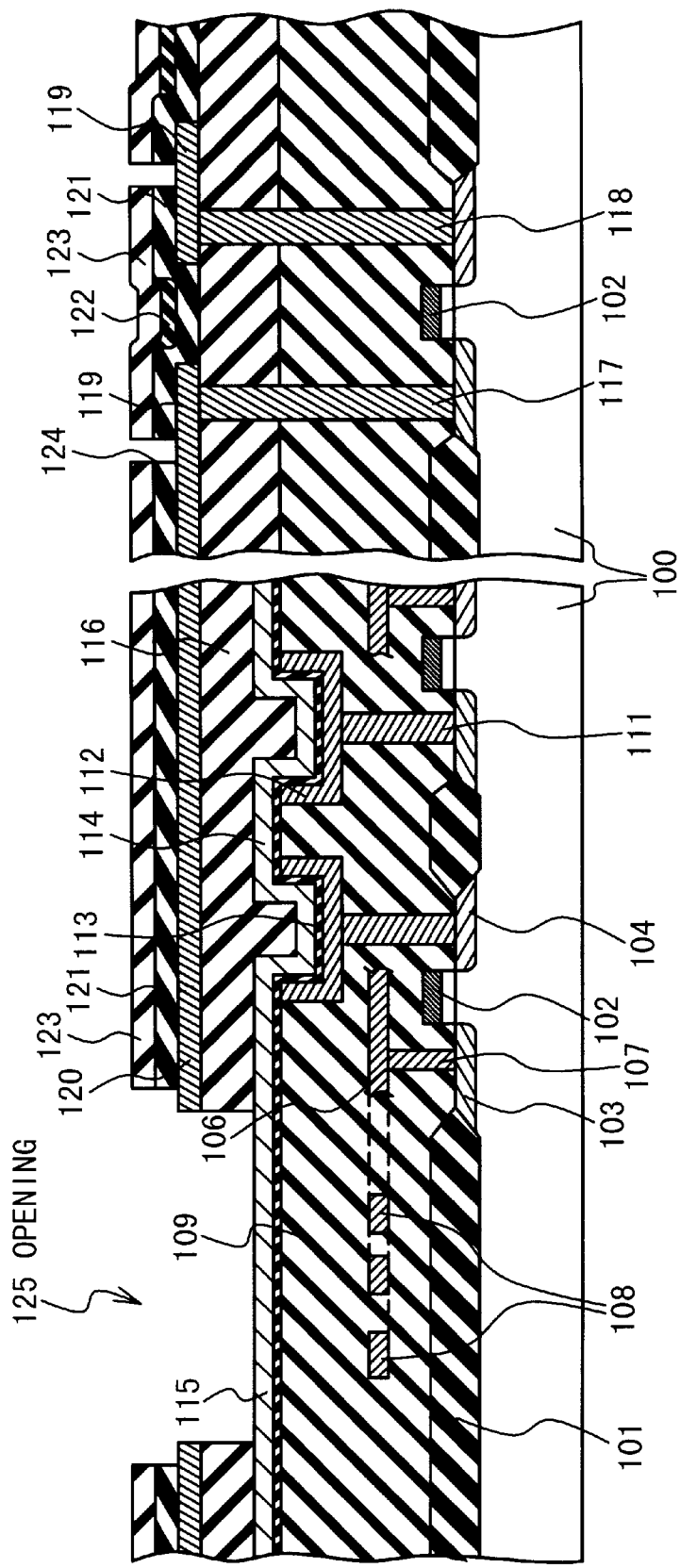

SEMICONDUCTOR MEMORY DEVICE MANUFACTURING METHOD WITH FUSE CUTTING PERFORMANCE IMPROVED

BACKGROUND OF THE INVENTION

1. Field of the Invention

The present invention relates to a semiconductor memory device with a redundancy circuit having a fuse and a fuse cutting performance improved.

2. Description of the Related Art

In recent years, an element size becomes small with the high integration of a semiconductor memory device, and it is necessary to consider the relief of element fault. In a technique for the relief of such an element fault, a memory circuit and a redundancy circuit are previously formed and an element of the redundancy circuit is used in place of a fault element of the memory circuit. A fuse is used to switch from the memory circuit to the redundancy circuit.

FIGS. 4A to 4F are cross sectional views showing a method of manufacturing of a conventional semiconductor memory device in order of the process. An internal circuit of the conventional semiconductor memory device contains memory cells and fuses.

First, as shown in FIG. 4A, an element separation oxide film 101, a word line 102 to function as the gate electrode of a memory cell transistor, a diffusion region 103 and a diffusion region 104 are formed on silicon substrate 100 so as to form a MOS transistor Q1. At this time, a large output MOS transistor Q2 is also formed in alperipheral circuit (not shown). Moreover, a bit line 106 is formed of a film of tungsten silicide (WSi) on a lower interlayer insulating film 105 in such a manner that the bit line is connected with the diffusion region 103 of the MOS transistor Q1 of the memory cell by a contact 107. Fuses 108 are formed of a part of the WSi film. An interlayer insulating film is formed on the fuse 108 to cover the fuses 108. An interlayer insulating film 109 is composed of the lower interlayer insulating film 105 and the interlayer insulating film to cover the fuses 108

Next, as shown in FIG. 4B, after forming a accumulation electrode 112 connected with the diffusion region 104 of the memory cell by a contact 111 and a capacitance insulating film 113 are formed, a counter electrode 114 is formed of a polysilicon film. Thus, a capacitor element C is formed. At this time, a part of the polysilicon film is also formed as an etching stopper film 115 in the region for a fuse cutting window to cover the fuses 108.

Next, as shown in FIG. 4C, after a second interlayer insulating film 116 is formed on the polysilicon film 115, the second interlayer insulating film 116 is selectively etched in the region for the fuse cutting window using the polysilicon film 115 as the etching stopper. Thus, an opening 125 is formed on the fuse.

Next, a first metal film is formed for the MOS transistor Q2 of the peripheral circuit 2 (not shown). At this time, the first metal film is formed to cover the opening 125, and is etched back. Thus, a first metal film 120 is formed to cover the inner side wall and peripheral portion of the opening. Subsequently, a portion of the polysilicon film 115 exposed in the bottom of the opening 125 is etched and removed using the first metal film 120 as a mask.

Next, as shown in FIG. 4D, the surface of the first metal film is flattened. That is, after a third interlayer insulating film 121 of a silicon oxide film is formed, an SOG film 122 is formed while a wafer is rotated. Then, project portions of the SOG film 122 are removed by a etching-back method or a CMP (chemical mechanical polishing) method. Thus, the surface of the first metal film is flattened. Moreover, a fourth interlayer insulating film 123 of a silicon oxide film is formed.

Next, as shown in FIG. 4E, a second metal film 126 is formed in the peripheral circuit (not shown). At the same time, a second metal film 127 is formed to have an opening in the opening 125 as shown in FIG. 4E. Then, as shown in FIG. 4F, the fourth interlayer insulating film 123, the SOG film 122, and the third interlayer insulating film 121 are etched in order in the opening 125 such that only the first interlayer insulating film 109 remains directly on the fuses 108 in the opening 125. Thus, the fuse cutting window 131 is formed where only the first interlayer insulating film 109 exists on the fuses 108.

It should be noted that although the subsequent processes are omitted, a cover film and a protection film are formed of insulating films to cover the films such as the SOG film 122 exposed in the fuse cutting window 131.

Therefore, in the fuse cutting window 131 formed in this way, the fuse 108 can be confirmed through the first interlayer insulating film 109 formed in the bottom of the fuse cutting window 131, as shown in FIG. 1. As shown in FIG. 1 by a broken line arrow, if a laser beam LB is selectively irradiated to the fuse 108 through the first interlayer insulating film 109, the fuse 108 is fused and cut by the energy of the laser beam LB. Through cutting of the fuse, the memory cell can be switched from the memory circuit to the redundancy circuit.

By the way, in the highly integrated DRAM in recent years, the memory cells and the fuses are highly integrated. When a plurality of fuses are arranged in parallel as described above, the array pitch is narrowed as small as about 2.5 $\mu$m. For this reason, when the fuse is fused and cut using the laser beam LB as described above, the laser beam must be irradiated to the fuse with a high resolution. However, in the conventional method of manufacturing the semiconductor memory device, it is difficult to form the insulating film which exists on the fuse, i.e., the first interlayer insulating film 109 to have a uniform film thickness. For this reason, as shown in FIG. 1, a part of the irradiated laser beam LB is reflected or scattered at the surface of the first interlayer insulating film 109, so that the laser beam LB is irradiated to a fuse 108A in the neighbor of the fuse 108, too. Thus, not only the fuse 108 but also the fuse 108A are fused and cut.

Also, because the film thickness of the first interlayer insulating film 109 remained on the fuse 108 (hereinafter, to be referred to as a remained film thickness) changes depending upon the place, the following problems would occur.

That is, first, the fuse 108 cannot be sometimes cut with a predetermined quantity of irradiation energy of the laser beam LB. For example, if the irradiation energy quantity of the laser beam LB is determined based on the small remained film thickness of the first interlayer insulating film 109, the fuse 108 existing under the first interlayer insulating film 109 having the large remained film thickness cannot be fused and cut.

Second, there would be a case where the surface of the fuse 108 is made rough with the irradiation of predetermined laser beam LB or an element region under the fuse 108 receives any damage. For example, if the irradiation energy of laser beam LB is determined based on the large remained film thickness of the first interlayer insulating film 109, the fuse 108 under the first interlayer insulating film 109 having the small remained film thickness is heated excessively, so that the fuse 108A in the neighbor of the fuse 108 is also fused and cut. Also, the neighborhood of the fuse is burned to weaken the first interlayer insulating film so that moisture becomes easy to invade. Also, the laser beam reaches an element forming region directly below the fuse to give any damage so that leak current increases.

In this way, it is an important problem in the manufacturing process to make the remained film thickness uniform.

The existence of the SOG film could be considered as the reason why the first interlayer insulating film 109 on the fuse 108 cannot be made flat or uniform in thickness. That is, in the manufacturing process shown in FIGS. 4A to 4F, the second interlayer insulating film 116 formed on the polysilicon film 115 is etched to form the opening 125 directly above the fuse 108 using polysilicon film 115 as the etching stopper. Subsequently, the third interlayer insulating film 121, the SOG film 122 and the fourth interlayer insulating film 123 are formed, and then the fourth interlayer insulating film 123, the SOG film 122 and the third interlayer insulating film 121 are etched to form the fuse cutting window 131.

However, when the SOG film 122 is formed, fluid SOG is dropped, and the wafer is rotated to make the SOG film uniform in thickness. For this reason, the centrifugal force due to the wafer rotation is different depending upon the position of the opening 125 and the film thickness of the SOG film 122 cannot be made uniform. According to the inventor'experiment, the remained film thickness of the first interlayer insulating film 109 is in a range of 0.9 to 1.1 µm in the thin portion and in a range of 1.4 to 1.6 µm in the thick portion. Thus, the deviation of about 0.5 µm was observed in the same wafer.

As shown in FIG. 4E, when the etching back is carried out in the SOG film 122, the SOG film 122 remaining above the fuse 108 in the opening 125 is not always in the state that the surface is flat. Therefore, the surface of the fourth interlayer insulating film 123 formed on the SOG film 122 is not in a flat state. For this reason, when the etching back is carried out to these insulating films to form the fuse cutting window 131, a part of the third interlayer insulating film 121 remains on the first interlayer insulating film 109. Thus, the first interlayer insulating film 109 is etched to have the non-uniform thickness. As a result, the surface of the first interlayer insulating film 109 existing on the fuse 108 is not flattened. Also, the SOG film 122 absorbs moisture easily. The SOG film 122 is exposed in the opening 125 in the fuse forming region. Thus, moisture invades from there to make the reliability of the semiconductor memory device decrease.

SUMMARY OF THE INVENTION

Therefore, an object of the present invention is to provide a semiconductor memory device and a method of manufacturing the same, in which an insulating film on a fuse is made uniform in thickness in a fuse cutting window so that the fuse can be correctly fused and cut.

In order to achieve an aspect of the present invention, a method of manufacturing a semiconductor memory device, includes:

forming a first interlayer insulating film having at least one fuse in the first interlayer insulating film;

forming an etching stopper film on the first interlayer insulating film;

forming a first layer on the etching stopper film;

etching the first layer to the etching stopper film using a first mask; and etching the etching stopper film to produce a fuse cutting window.

Here, to form the first layer, a second interlayer insulating film is formed on the etching stopper film, a first metal film is formed to have a first opening which is formed in a region for the fuse cutting window and which has a size larger than the fuse cutting window, and a third interlayer insulating film is formed on the second interlayer insulating film and the first metal film. In this case, to etch the first layer, the third film is etched using the first mask, and then the second interlayer insulating film is etched using the first metal film as a second mask. In this case, the first mask preferably has a size larger than the first opening of the metal film.

Also, in the manufacturing method, the surface of the first interlayer insulating film is flattened before the etching stopper film is formed.

Also, to form a first interlayer insulating film, a fourth interlayer insulating film is formed, a surface of the fourth interlayer insulating film is flattened, at least one fuse is formed on the flattened fourth interlayer insulating film. Then, a fifth interlayer insulating film is formed on the at least one fuse and the flattened fourth interlayer insulating film.

Also, when the etching stopper is conductive, and a second opening is formed through the etching of the second interlayer insulating film, a second metal film is formed on inner side wall of the second opening to connect the etching stopper film to the first metal film, and a sixth interlayer insulating film is formed to cover a bottom of the second opening and the second metal film. In the etching the etching stopper film, the sixth interlayer insulating and then the etching stopper film are etched to produce the fuse cutting window.

Also, it is preferable that the etching stopper film is formed of a material having an etching selection ratio to a material of the second and third interlayer insulating films. The etching stopper film is formed of polysilicon, and is used as one of electrodes of a capacitor of a memory cell. Alternatively, the etching stopper film may be formed of silicon nitride.

In the etching the etching stopper film, the first interlayer insulating film is preferably etched in addition to the etching stopper film such that a film thickness of the etched first interlayer insulating film on the at least one fuse is equal to or less than 1µam. Also, when a plurality of the fuses are formed in the first interlayer insulating film, deviation of the film thicknesses of the etched first interlayer insulating film on the plurality of fuses is preferably equal to or less than 0.3 µm.

In order to achieve another aspect of the present invention, a semiconductor memory device, includes a first interlayer insulating film having at least one fuse therein, an etching stopper film formed on the first interlayer insulating film, a second interlayer insulating film formed on the etching stopper film, a first metal film formed to have a first opening, a third interlayer insulating film formed on the second interlayer insulating film and the first metal film, a fuse cutting window formed to pass through the third interlayer insulating film, the first opening of the first metal film, the second insulating film, and the etching stopper film, a fourth interlayer insulating film formed to cover an inner side wall of the fuse cutting window and the third interlayer insulating film.

Here, the semiconductor memory device may further includes a cell transistor a source and a drain and formed on a semiconductor substrate, and a memory capacitor having two electrodes film to sandwich a capacitance layer and connected to one of the source and the drain of the cell transistor. It is preferable that the etching stopper film is one of the two electrodes.

Also, the semiconductor memory device may further includes a second metal film formed under the fourth interlayer insulating film in the inner side wall of the fuse cutting window to connect the etching stopper film and the first metal film.

Also, the memory capacitor includes a lower one of the two electrodes formed to cover a bottom and inner side wall of a concave section which has formed in the first interlayer insulating film, the capacitance layer formed to cover the first interlayer insulating film and the lower electrode, and an upper one of the two electrodes formed to cover the first interlayer insulating film.

Also, the etching stopper film is preferably formed of polysilicon. Alternatively, the etching stopper film may be formed of silicon nitride.

Also, it is preferable that a distance between a bottom of the fuse cutting window and the at least one fuse is equal to or less than 1 $\mu$m. In this case, it is preferable that deviation of the distances between the bottom of the fuse cutting window and the plurality of fuses is equal to or less than 0.3 $\mu$m.

BRIEF DESCRIPTION OF THE DRAWINGS

FIGS. 3A to 3G are cross sectional views of the semiconductor memory device according to the embodiment of the present invention in a manufacturing method along the line A-A line of FIG. 2.

DESCRIPTION OF THE PREFERRED EMBIDIMENTS

Hereinafter, a semiconductor memory device of the present invention will be described with reference to the attached drawings.

Figure 2:
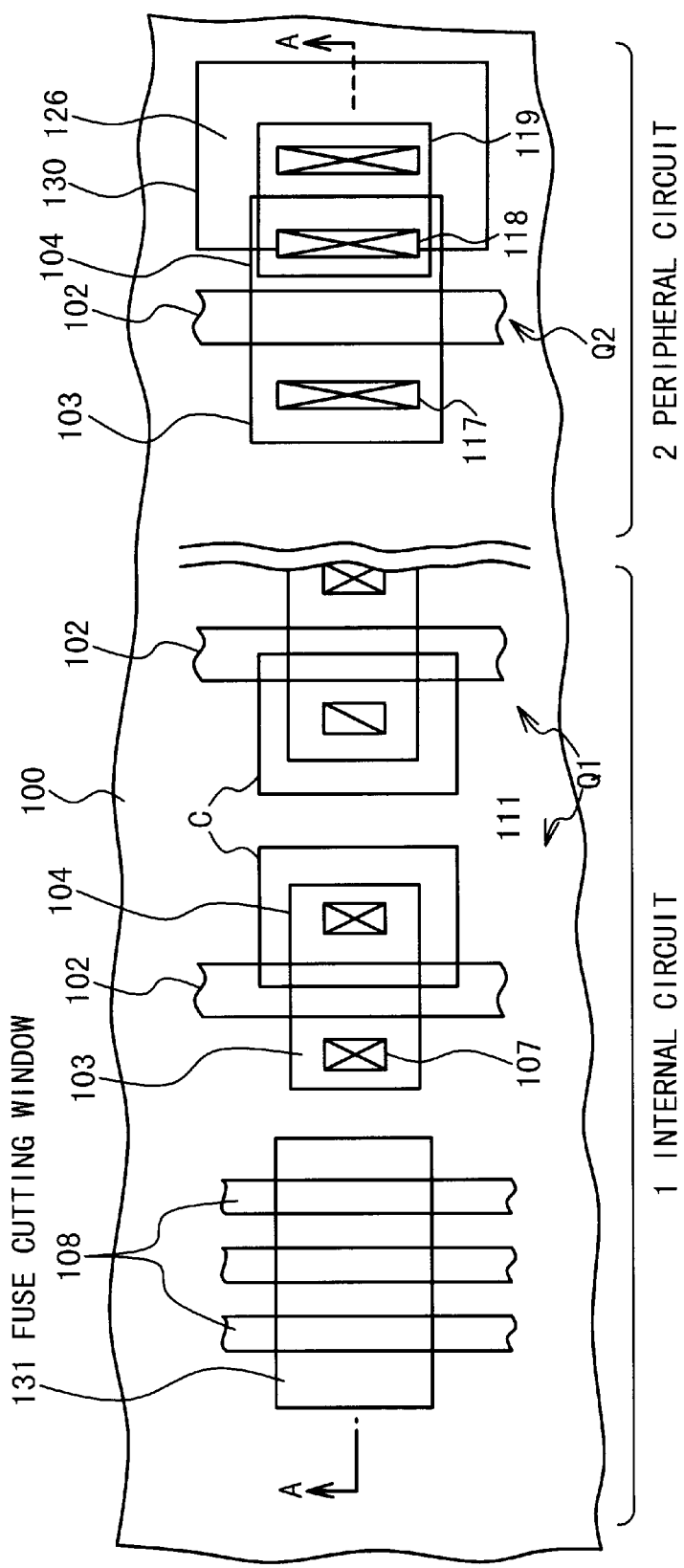
FIG. 2 is a plan view of a semiconductor memory device according to an embodiment of the present invention.

FIG. 2 i s a plan view of an example of a semiconductor memory device with a redundancy circuit and fuses. The semiconductor memory device is a DRAM having a memory cell as the element. Referring to FIG. 2, an internal circuit 1 having memory cells and fuses and a peripheral circuit 2 having transistors for circuits such as a logic circuit and an input/output circuit are formed on a silicon substrate 100. In this example, the internal circuit 1 is composed of MOS transistors Q1 and capacitor elements C connected with the MOS transistors Q1, respectively. The fuses 108 are provided in a region other than the region of the memory circuit and the region of the redundancy circuit. The fuse is irradiated with a laser beam and is fused and cut so that a part of the memory circuit is switched to the redundancy circuit.

FIGS. 3A to 3G are cross sectional views of the semiconductor memory device according to the embodiment of the present invention in order of the manufacturing process, when a manufacturing method of the present invention is applied to a DRAM shown in FIG. 2. These figures are the cross sectional views of the semiconductor memory device along the line A—A in FIG. 2. It should be noted that the internal circuits 1 with memory cells and fuses and the peripheral circuits 2 containing an input/output circuit are shown in these figures. Also, the same reference numerals or symbols are allocated to the same components as in the conventional semiconductor memory device shown in FIG. 1, to distinguish the present invention from the conventional semiconductor memory device.

Figure 3A:
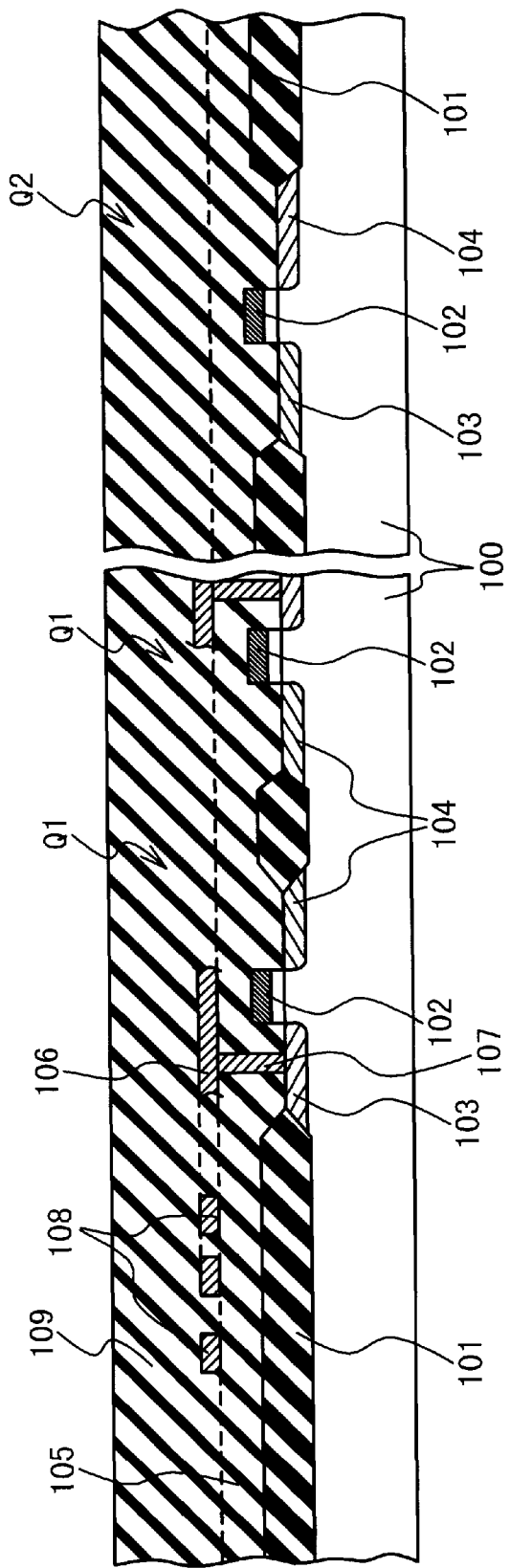

As shown in FIG. 3A, the surface of silicon substrate 100 is selectively oxidized and element separation insulating films 101 are formed to segment device regions. Then, in the device region, gate electrodes 102, diffusion regions 103 and 104 as source regions and drain regions are formed by the well-known manufacturing method. Also, a lower insulating film 105 is formed of a silicon oxide film to have the film thickness of 0.2 to 0.5 $\mu$m. A MOS transistor Q1 for a memory cell is formed in the internal circuit 1, and a MOS transistor Q2 for an input/output circuit is formed in a peripheral circuit 2.

Next, a tungsten silicide (WSi) film is formed on the lower insulating film 105, and the WSi film is patterned to form a bit line 106. At this time, a contact 107 is formed in the MOS transistor Q1 of the internal circuit 1 to connect the bit line 106 with the diffusion region 103. Also, fuses 108 is formed in the region on the element separation insulating film 101 of the internal circuit 1, using a part of the WSi film. In this case, it is preferable that the surface of the interlayer insulating film 105 is flattened before the Wsi film is formed. Then, the interlayer insulating film 109 is formed of a silicon oxide film to have the film thickness of 0.6 to 1.8 $\mu$m to cover the bit line 106, the fuse 108 and the interlayer insulating film 105. The film thickness of the interlayer insulating film changes depending upon the shape of the memory cell. Also, a first interlayer insulating film 109 is composed of the interlayer insulating film 105 and the interlayer insulating film form on the film 105.

Figure 3B:
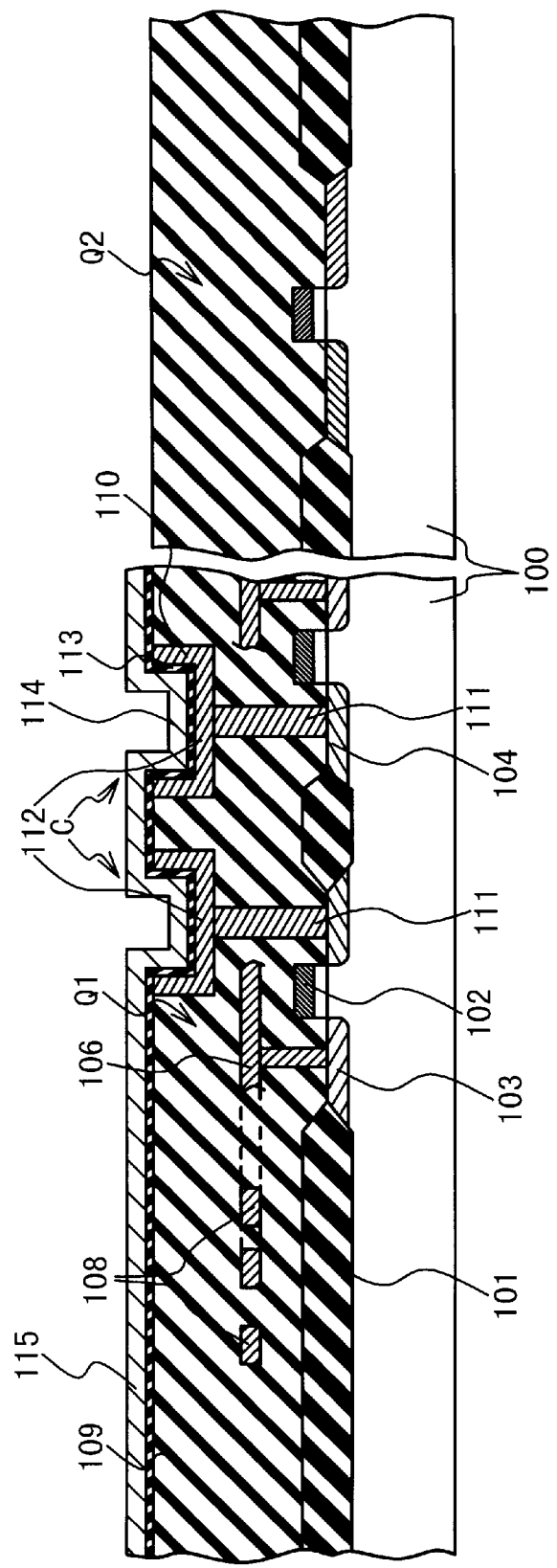

Next, as shown in FIG. 3B, the first interlayer insulating film 109 is selectively etched above the diffusion region 104 of the MOS transistor Q1 for the memory cell in the internal circuit 1 region to form a capacity concave section 110. Also, a contact 111 is formed to reach the diffusion region 104. Then, a first polysilicon film is formed on the first interlayer insulating film 109, containing the capacity concave section 110. The first polysilicon film is connected with the diffusion region 104 by the contact 111. Subsequently, the first polysilicon film is selectively etched and patterned to form a crown-type accumulation electrode 112. Then, a silicon oxide film as a capacitance film and a second polysilicon film are formed. In this case, it is preferable that the first interlayer insulating film 109 is flattened by an etching method or a CMP method, before the silicon oxide film and the second polysilicon film are formed.

Moreover, the silicon oxide film and the second polysilicon film are selectively etched and patterned to form a capacity insulating film 113 and a counter electrode 114. Thus, the capacitor element C of the memory cell is formed. At this time, a part of the second polysilicon film is remained in the region for a fuse cutting window to cover the fuses 108 as an etching stopper film 115.

Figure 3C:
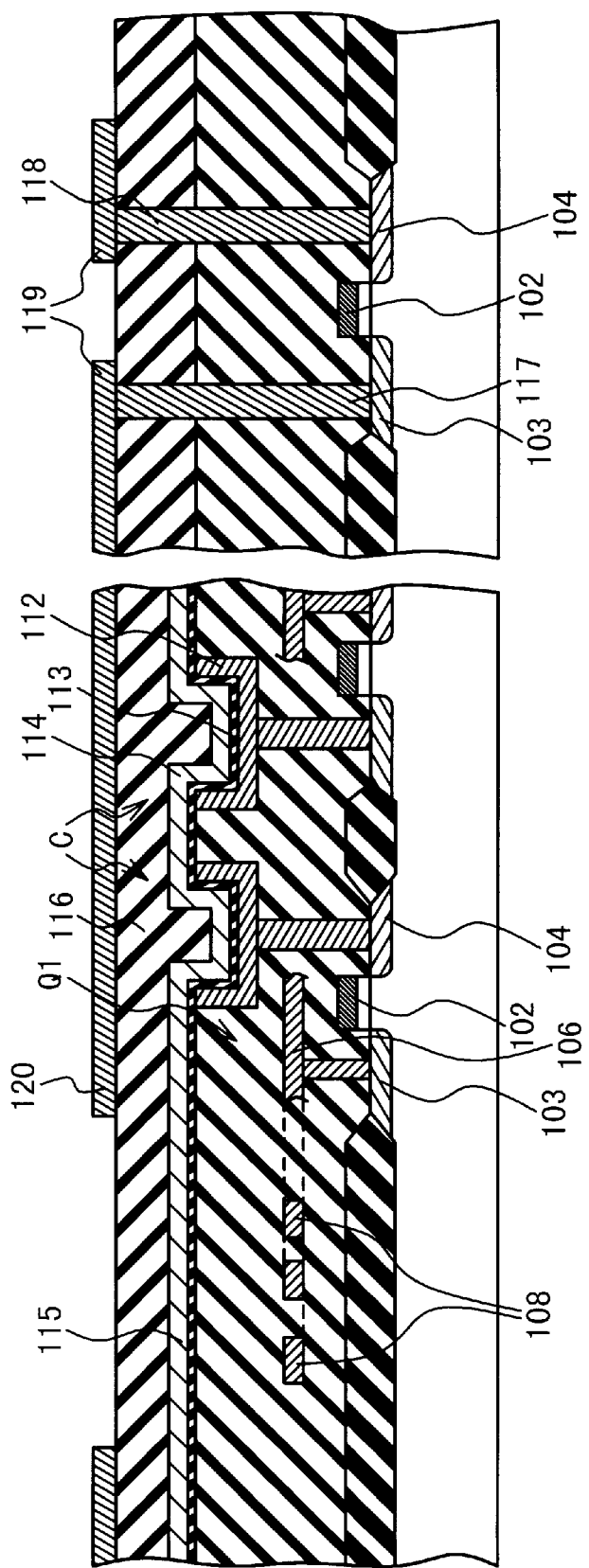

Next, as shown in FIG. 3C, after the second interlayer insulating film 116 is formed of a silicon oxide film, contact holes 117 and 118 are formed. Then, a first metal film is formed, and then is patterned to the required shape to form the first metal wiring pattern 119. At this time, the first metal wiring pattern 119 is connected with the diffusion regions 103 and 104 of the MOS transistor Q2 of the peripheral circuit 2 through the contacts 117 and 118. Also, an opening is formed in a part of the first metal film in the region for the fuse cutting window above the fuse 108 of the internal circuit 1. Thus, the first metal film 120 is formed.

Figure 3D:
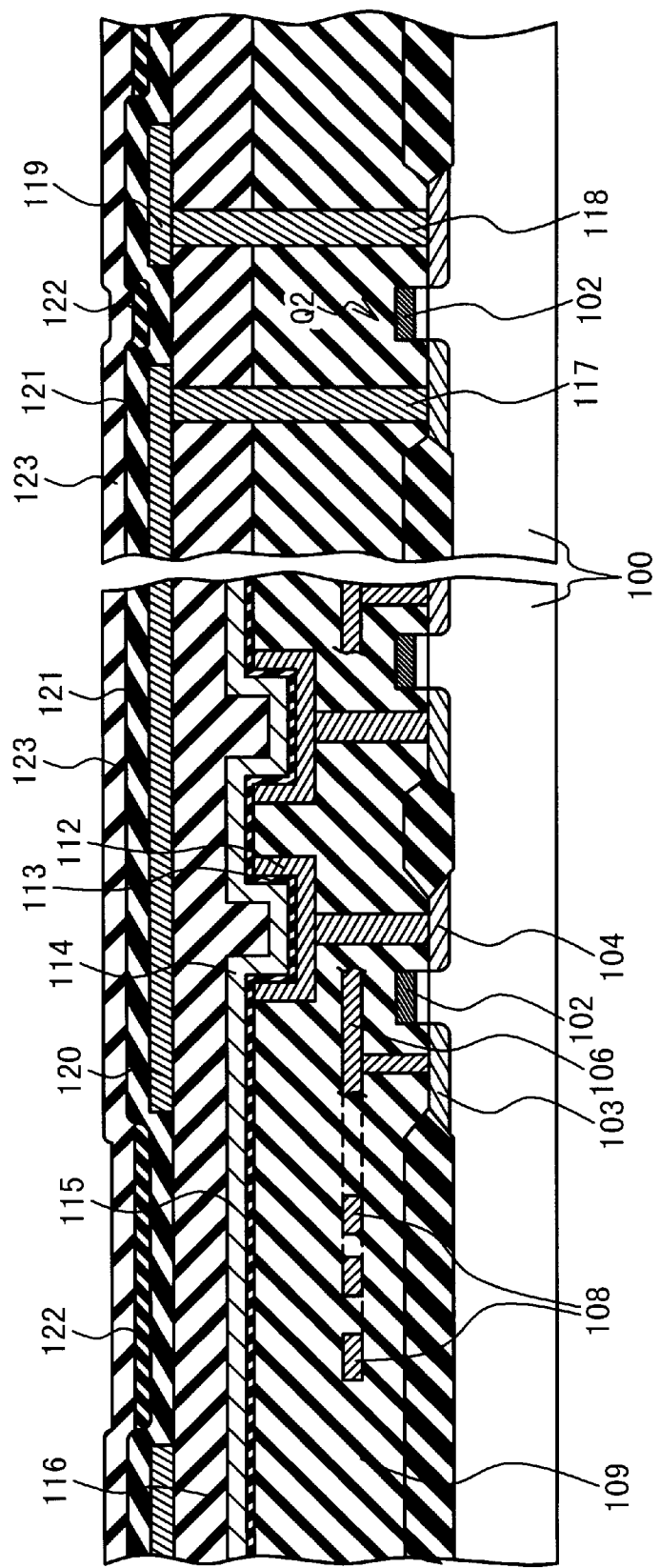

Next, as shown in FIG. 3D, the third interlayer insulating film 121 is formed of a silicon oxide film, and then an SOG film 122 is formed by spin-coating for flatness. Subsequently, the SOG film is etched back or polished by the CMP method. Then, a fourth interlayer insulating film 123 is formed on the flattened SOG film 122.

The step produced due to the first metal wiring pattern 119 and the first metal film 120 is eased by the interlayer insulating film containing the SOG film 122. Thus, the surface is made roughly flat. At this time, because the region surrounded by the first metal film 120 is formed to have a concave section in the region for the fuse cutting window, the SOG film 122 is remained in this concave section.

Next, as shown in FIG. 3E, in the peripheral circuit 2, the interlayer insulating films containing the SOG film 122, i.e., the fourth interlayer insulating film 123, the SOG film 122 and the third interlayer insulating film 121 are selectively etched in order. Then, a through-hole 124 is formed for electrical connection with the first metal wiring pattern 119. At the same time, in the internal circuit 1, the SOG film 122 and the interlayer insulating films 121 and 123 are selectively etched in the region for the fuse cutting window, using the first metal film 120 as a mask. At this time, the second interlayer insulating film 116 is etched in addition to the fourth interlayer insulating film 123, the SOG film 122, and the third interlayer insulating film 121.

In this case, because the polysilicon film 115 as the etching stopper film exists directly under the second interlayer insulating film 116, the etching is ended on the surface of the polysilicon film 115. Thus, the opening 125 for the fuse cutting window is formed. Here, fluorocarbon gas such as $CF_4$, $C_2F_6$ and $C_4F_8$ is used as an etching gas. Because the opening 125 is formed using the first metal film 120 as the mask, it is not necessary to strictly adjust the mask used to etch and pattern the fourth interlayer insulating film. The mask for the fourth interlayer insulating film is sufficient to be roughly adjusted in a region wider than the opening region of the first metal film 120. In this way, the SOG film 122 which has been formed in the opening 125 is possible to be completely removed without any remaining portion to prevent invasion of moisture.

Figure 3F:
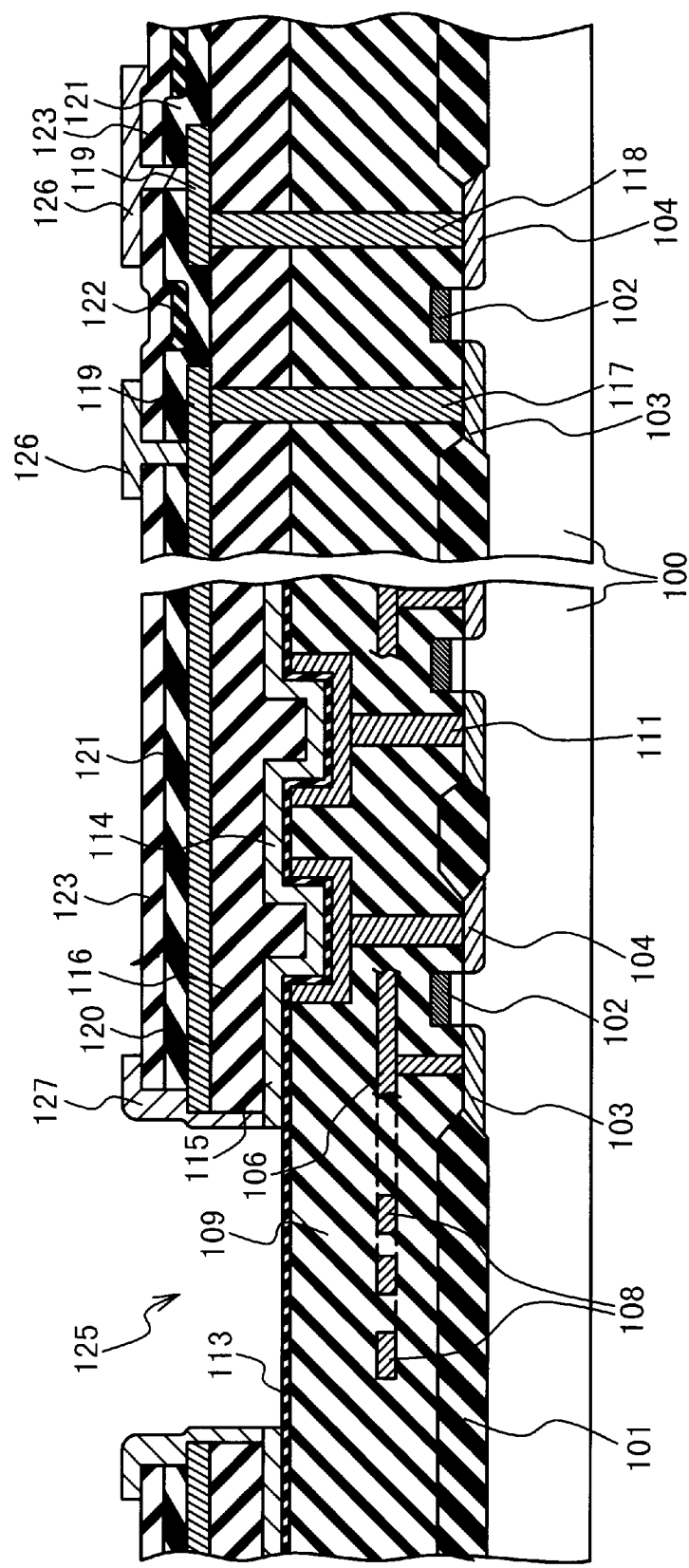

Next, as shown in FIG. 3F, in the peripheral circuit 2, the second metal film is formed and patterned to the required pattern by an anisotropic etching such as a dry etching. Thus, the second metal wiring pattern 126 containing a pad electrode which connected with the first metal wiring pattern 119 is formed. At the same time, the second metal film is formed to cover an inner side wall of the fuse cutting window in the internal circuit 1. Through the above anisotropic etching, the second metal film 127 is remained on the inner side wall of the opening 125 for the fuse cutting window. Also, the polysilicon film 115 at the bottom of the opening 125 for the fuse cutting window is etched through the above etching. Thus, the capacitance insulating film 113 or the first interlayer insulating film 109 is exposed.

Figure 3G:
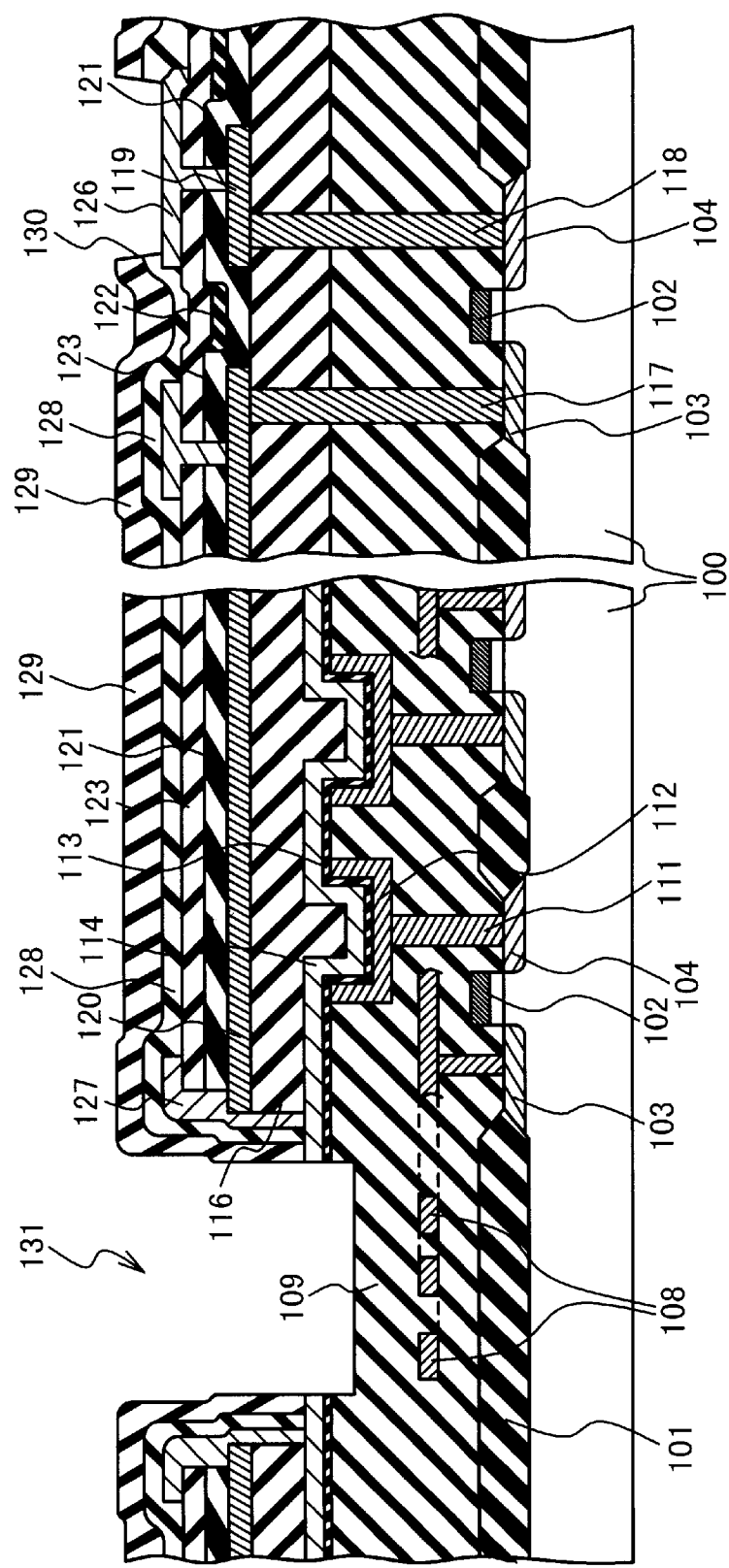
Figure 4A:
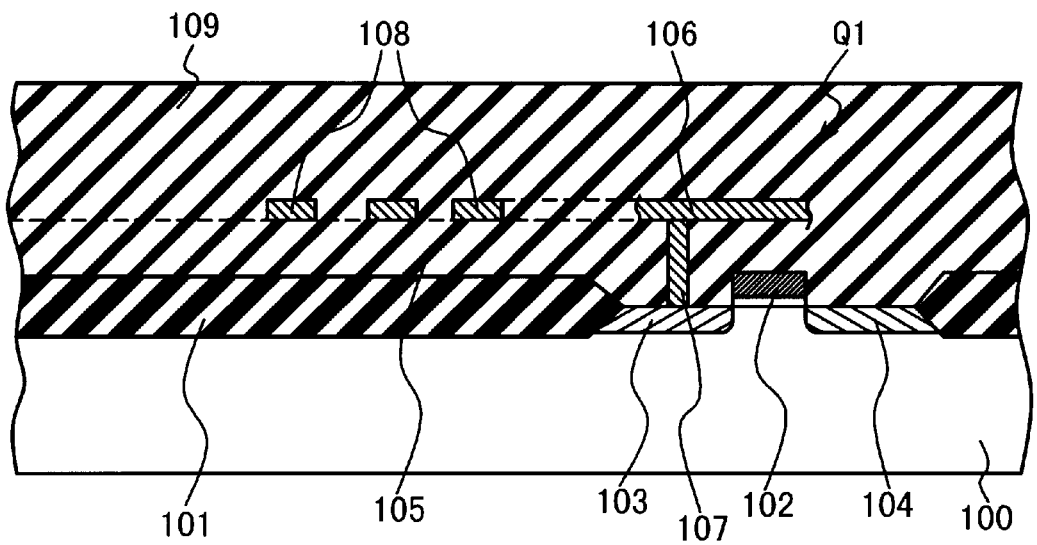
FIGS. 4A to 4F are cross sectional views of the conventional semiconductor memory device in a manufacturing method.
Figure 4B:
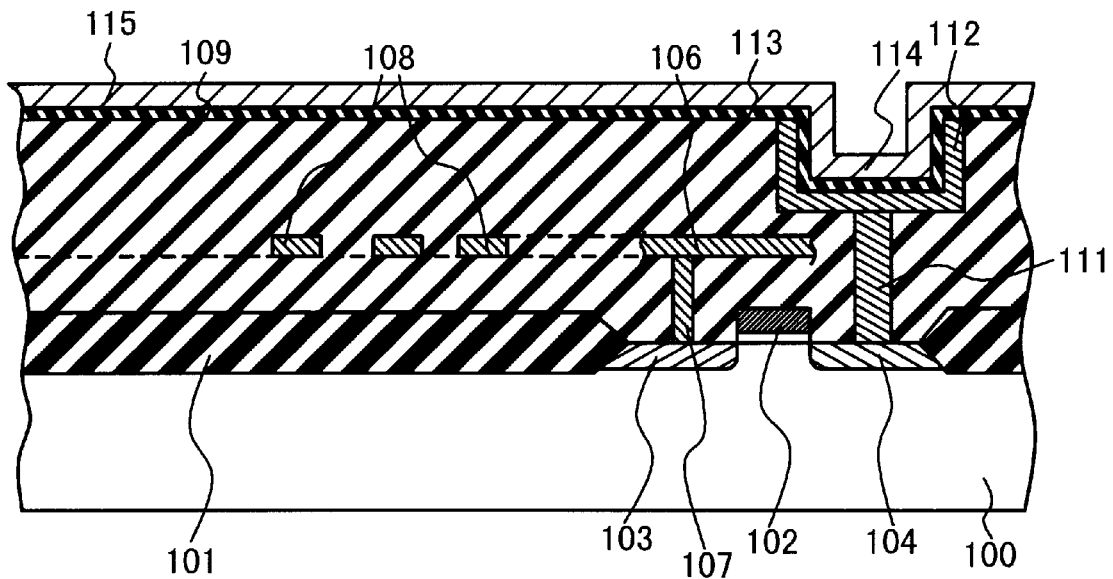
Figure 4C:
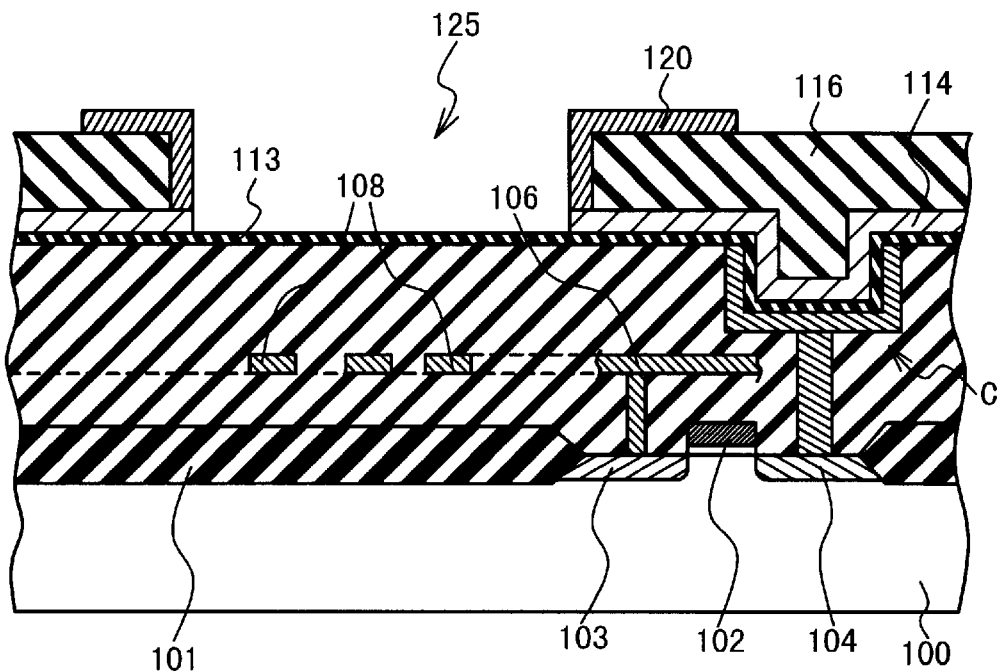
Figure 4D:
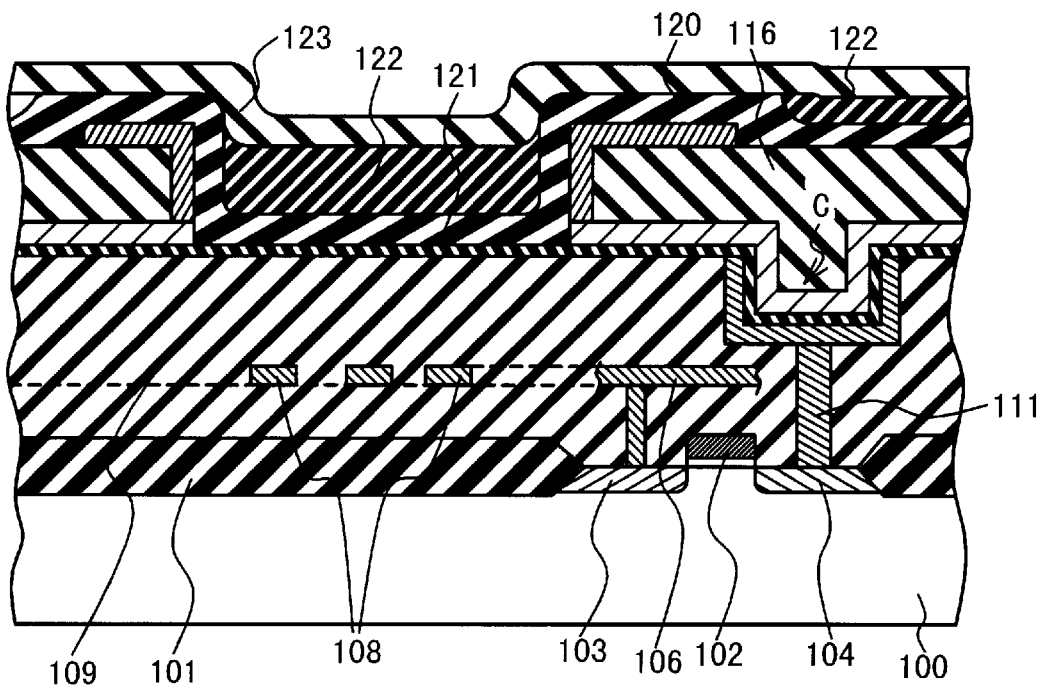
Figure 4E:
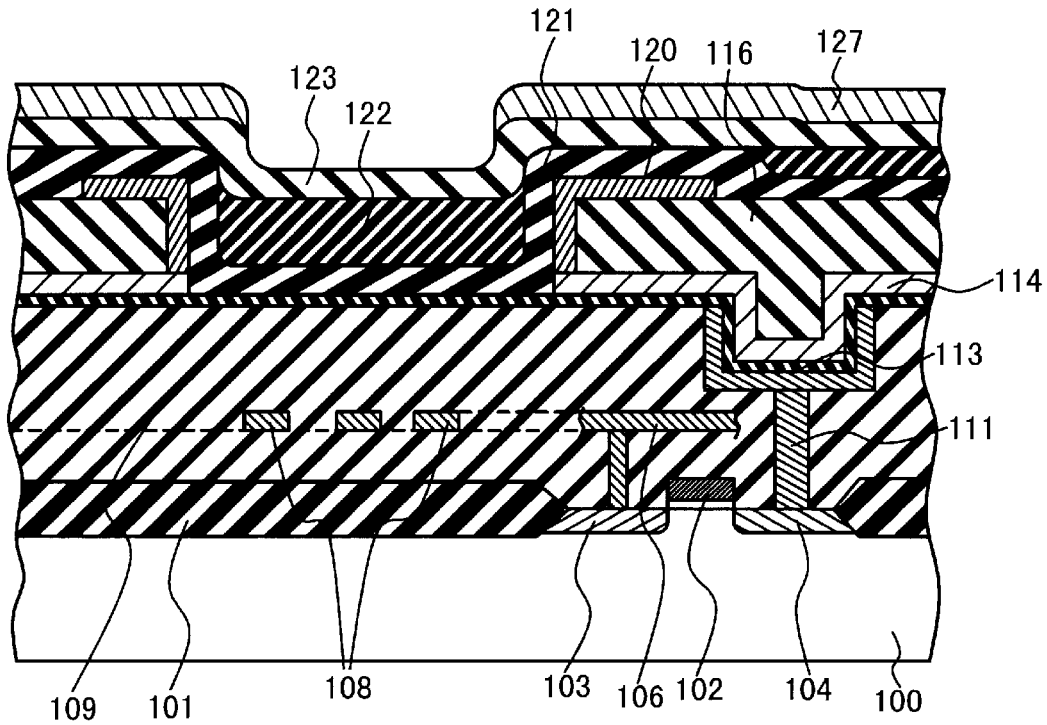
Figure 4F:
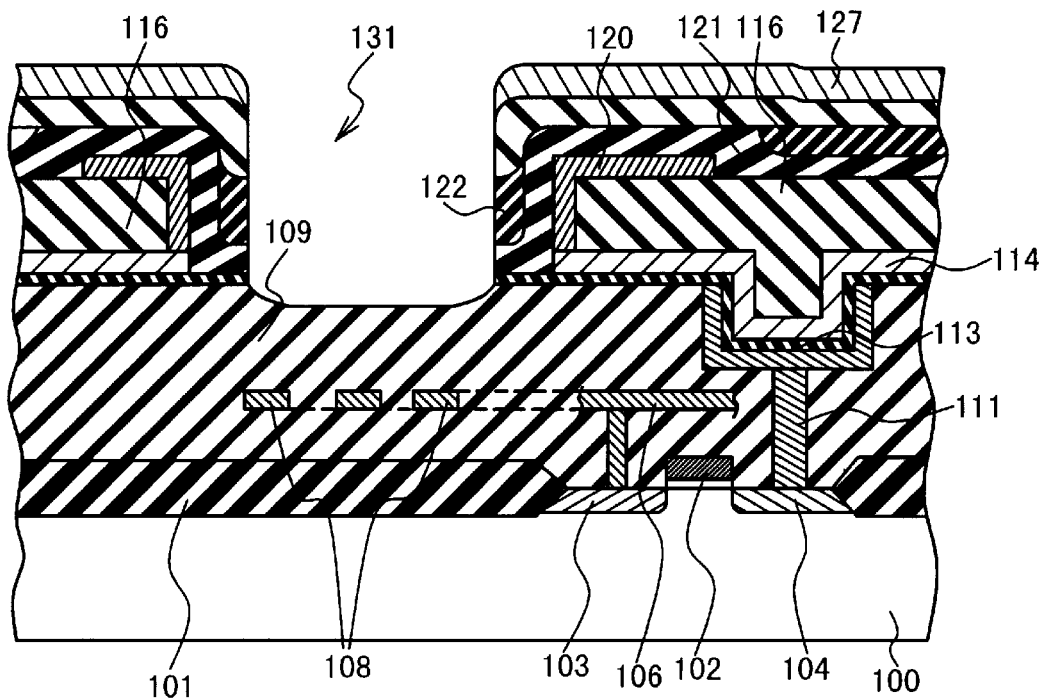

After that, as shown in FIG. 3G, a cover film 128 of a silicon oxide film is formed on the whole surface and a protection film 129 of a silicon nitride film is formed on the cover film 128. In the peripheral circuit 2, the cover film 128 and the protection film 129 is selectively etched to form a pad opening 130. Thus, a part of the second metal wiring pattern 126 is formed as the pad electrode. Also, at the same time, in the internal circuit 1, the cover film 128 and protection film 129 in the opening 125 for the fuse cutting window are etched and then the capacitance insulating film 113 and the first interlayer insulating film 109 are etched to a required film thickness. Thus, the fuse cutting window 131 is formed. It should be noted that the surface of the first interlayer insulating film 109 may be etched at this time or may not.

In this way, the semiconductor memory device is formed. With the structure of the fuse cutting window 131 of the internal circuit 1, the etching is carried out in the process of FIG. 3F in the state that the SOG film 122 does not exist. That is, the insulating films 129, 128, 112 and 109 on or above the fuses 108 are selectively etched so as to form the fuse cutting window 131. That is, because the polysilicon film 115 exists as the etching stopper directly below the second interlayer insulating film 116 in the region for the fuse cutting window 131, the bottom of the opening 125 for the fuse cutting window is formed to have a flat surface regardless of the state of the surface of SOG film 122 after this etching process. This is because the polysilicon film 115 has the flat surface. Therefore, in the etching process of FIG. 3G, the etching is carried out in the region for the fuse cutting window 131 in the state of the completely uniform flat surface. As the result, the bottom surface of the fuse cutting window 131 is made flat. Thus, the film thickness of the first interlayer insulating film 109 directly on each of the fuses 108 is uniformed.

Figure 1:
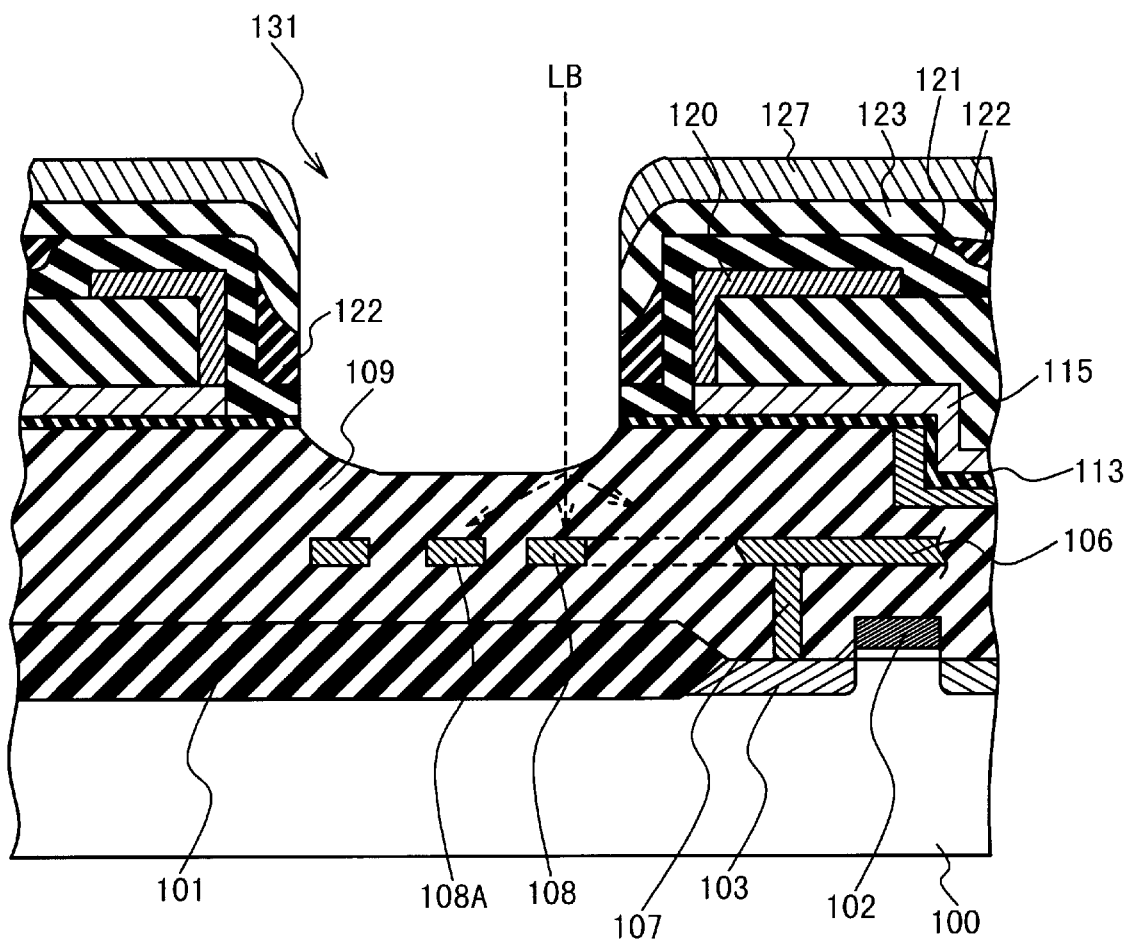
FIG. 1 is a cross sectional view of a conventional semiconductor memory device.

When the laser beam is irradiated to fuse and cut the fuse, the extraordinary refraction and scattering of the laser beam on the surface of the first interlayer insulating film 109 shown in FIG. 1 can be prevented. In this way, the fusing and cutting to fuses in the neighbor of the fuse can be prevented. Also, the target fuse can be fused and cut to switch to the redundancy circuit.

By applying the above method, the deviation of the remained film thickness could be suppressed within 0.2 $\mu$m. Therefore, unlike the conventional example, there is no case that the fuse cannot be fully cut because of the lack in the irradiation energy of the laser beam LB, or the surface of the fuse is made rough because of the excessive irradiation energy of laser beam LB. Also, there is no case that the device region below the fuse receives damage. As a result, the cutting of the fuse can be carried out in the good condition, resulting in the semiconductor memory device with high reliability. Also, in order to cut the fuse with the laser beam, it is desirable that the remained film thickness is equal to or less than 1 $\mu$m. Also, if the deviation of the remained film thickness is within 0.3 $\mu$m, the problems in the conventional example could be canceled. Moreover, it is more desirable that the deviation of the remained film thickness is within 0.2 $\mu$m, because the control of the laser cutting process can be simplified.

Here, in the embodiment, a part of the polysilicon film as the counter electrode 113 of the capacitor element C of the memory cell functions as the etching stopper film 115. However, an etching stopper film may be formed independently from the counter electrode 113. In this case, the material of the etching stopper film is never limited to the material of the counter electrode 113. The material of the etching stopper film is sufficient to have an etching selectivity to the silicon oxide films as the interlayer insulating films, and the first interlayer insulating film 109 formed directly on the fuse 108. For example, the etching stopper film may be formed of a silicon nitride film.

Also, in the above examples, the semiconductor memory device is explained to have a 2-layer wiring pattern.

However, the present invention can be applied to the semiconductor memory device having a multiple layer wiring pattern. At this time, it is desirable that an etching process for the opening 125 is carried out after the SOG film is coated last.

As described above, according to the semiconductor memory device of the present invention, the film thickness of the insulating film on each of the plurality of fuses is uniformed, because the bottom surface of the fuse cutting window can be made flat. When the laser beam is irradiated to fuse and cut the fuse, the extraordinary refraction and scattering of the laser beam on the insulating film surface and the fusing and cutting of an adjacent fuse can be prevented. Thus, the target fuse can be fused and cut with reliability to switch to a redundancy circuit.

Also, according to the manufacturing method of the present invention, the lower flat etching stopper film exists at the time of the etching of the SOG film. The etching is carried out in the state in which the SOG film does not exist, in the process which the insulating film on the fuse is selectively etched finally to form the fuse cutting window. Therefore, the surface of the insulating film on the fuse becomes able to be formed as the flat surface of the etching stopper film regardless of the flatness of the surface of the SOG film.

What is claimed is:

1. A method of manufacturing a semiconductor memory device, comprising:

forming a first interlayer insulating film having at least one fuse in said first interlayer insulating film;

forming an etching stopper film on said first interlayer insulating film;

forming a second interlayer insulating film on said etching stopper film;

forming a first metal film on said second interlayer insulating film with a first opening formed in a region for a fuse cutting window and having a size larger than said fuse cutting window; and etching said second interlayer insulating film using said first metal film as a second mask.

2. A method according to claim 1, wherein said first mask has a size larger than said first opening of said metal film.

3. A method according to claim 1, further comprising:

forming a third interlayer insulating film on said second interlayer insulating film and said first metal film;

etching said third interlayer insulating film using a first mask; and flattening a surface of said first interlayer insulating film before said etching stopper film is formed.

4. A method according to claim 3, wherein said forming a first interlayer insulating film includes:

forming a fourth interlayer insulating film;

flattening a surface of said fourth interlayer insulating film;

forming said at least one fuse on said flattened fourth interlayer insulating film; and forming a fifth interlayer insulating film on said at least one fuse and said flattened fourth interlayer insulating film, wherein an opening of said first mask is larger than the opening of said first metal film.

5. A method according to claim 1, wherein said etching stopper film is conductive, and a second opening is formed through said etching of said second interlayer insulating film, and wherein said method further comprises:

forming a second metal film on an inner side wall of said second opening to connect said etching stopper film to said first metal film; and forming a sixth interlayer insulating film to cover a bottom of said second opening and said second metal film, and wherein an etching of said etching stopper film includes:

etching said sixth interlayer insulating film and then said etching stopper film to produce said fuse cutting window.

6. A method according to claim 3, wherein said etching stopper film is formed of a material having an etching selection ratio to a material of said second and third interlayer insulating films.

7. A method according to claim 1, wherein said etching stopper film is formed of polysilicon, and is used as one of electrodes of a capacitor of a memory cell.

8. A method according to claim 1, wherein said etching stopper film is formed of silicon nitride.

9. A method according to claim 1, wherein said etching stopper film is formed of a material having an etching selection ratio to a material of said second interlayer insulating film.

10. A method according to claim 3, wherein said etching stopper film is formed of polysilicon, and is used as one of electrodes of a capacitor of a memory cell.

11. A method according to claim 3, wherein said etching stopper film is formed of silicon nitride.

* * * * *